US008055463B1

(12) United States Patent
Benckenstein et al.

(10) Patent No.: US 8,055,463 B1
(45) Date of Patent: Nov. 8, 2011

(54) FUEL GAUGE

(75) Inventors: Claude Leonard Benckenstein, Sugarland, TX (US); Clint Alfred Davis, Stafford, TX (US); Dean Perkins, Tomball, TX (US)

(73) Assignee: Southwest Electronic Energy Corporation, Stafford, TX (US)

( * ) Notice: Subject to any disclaimer, the term of this patent is extended or adjusted under 35 U.S.C. 154(b) by 709 days.

(21) Appl. No.: 12/190,893

(22) Filed: Aug. 13, 2008

(51) Int. Cl.
*G01R 31/36* (2006.01)

(52) U.S. Cl. .............................. 702/63; 702/65; 320/132

(58) Field of Classification Search .................. 702/60, 702/61, 63–65, 136; 320/132, 149; 324/426–428
See application file for complete search history.

(56) References Cited

U.S. PATENT DOCUMENTS

| | | | |
|---|---|---|---|
| 5,614,829 A * | 3/1997 | Song | 324/427 |
| 7,397,217 B2 * | 7/2008 | Van Brocklin et al. | 320/101 |

* cited by examiner

*Primary Examiner* — Manuel L Barbee
(74) *Attorney, Agent, or Firm* — Fulbright & Jaworski L.L.P.

(57) ABSTRACT

A fuel gauge for power supplies having a voltage pre-regulator; a main voltage regulator; a current sense resistor; an integrator with an op amp and capacitor, wherein the integrator receives power from the main voltage regulator, and receives a voltage proportional to current from the current sense resistor; a microprocessor with data storage and a hysteresis circuit, wherein the microprocessor operates in a low power state until activated by the resistor and the microprocessor converts the voltage proportional to current to a monotonic uni-polar representation of an aggregate number of electrons; a resistor disposed between the integrator and the microprocessor for activating the microprocessor from the low power state prior to saturation of the integrator with the voltage proportional to current; and a reset circuit disposed between the microprocessor and the integrator for resetting the monotonic uni-polar representation of an aggregate number of electrons to zero.

14 Claims, 2 Drawing Sheets

FUEL GAUGE

FIELD

The present embodiments relate to a fuel gauge for tracking electron flow from a power source.

BACKGROUND

A need exists for an accurate gauge that can be used in remote locations, and in locations where operation of a processor clock or similar device is not possible, such as within an oil well, with a microprocessor that can be operated in a low current state to track power usage.

A further need exists for an inexpensive, highly versatile fuel gauge for tracking electron usage, thereby determining remaining battery capacity independent of a necessity to accurately record elapsed time per unit current.

The present embodiments meet these needs.

BRIEF DESCRIPTION OF THE DRAWINGS

The detailed description will be better understood in conjunction with the accompanying drawings as follows.

The present embodiments are detailed below with reference to the listed Figures.

DETAILED DESCRIPTION OF THE EMBODIMENTS

Before explaining the present apparatus in detail, it is to be understood that the apparatus is not limited to the particular embodiments and that it can be practiced or carried out in various ways.

The present embodiments relate generally to a fuel gauge usable to track electron flow.

Typically, remaining capacity of a power source is measured by recording the amount of current maintained per a unit of time. In extreme conditions, such as the high temperatures and pressures encountered within a wellbore, the accurate tracking of the passage of time, such as through use of a processor-based clock, is not possible.

The present fuel gauge measures the capacity of a power source independent of elapsed time by tracking electron flow, rather than current per unit time. During operation of a power source, an integrator receives a voltage proportional to the current maintained. Prior to saturation of the integrator, a microprocessor converts the voltage to a monotonic uni-polar representation of an aggregate number of electrons and records this value. Once this value reaches a calibration constant, a known quantity of current has been maintained, such as one mA/hour, enabling capacity of the power source to be calculated in standard engineering units. The accumulated value can then be reset, allowing further accumulation until the calibration constant is again reached.

The fuel gauge can be used with lithium primary batteries, lead acid batteries, lithium ion batteries, fuel cells, and solar panel systems. The fuel gauge can be useable for high precision tracking of electron flow, enabling remaining capacity of a power source to be calculated through tracking of electron flow.

Figure 1:
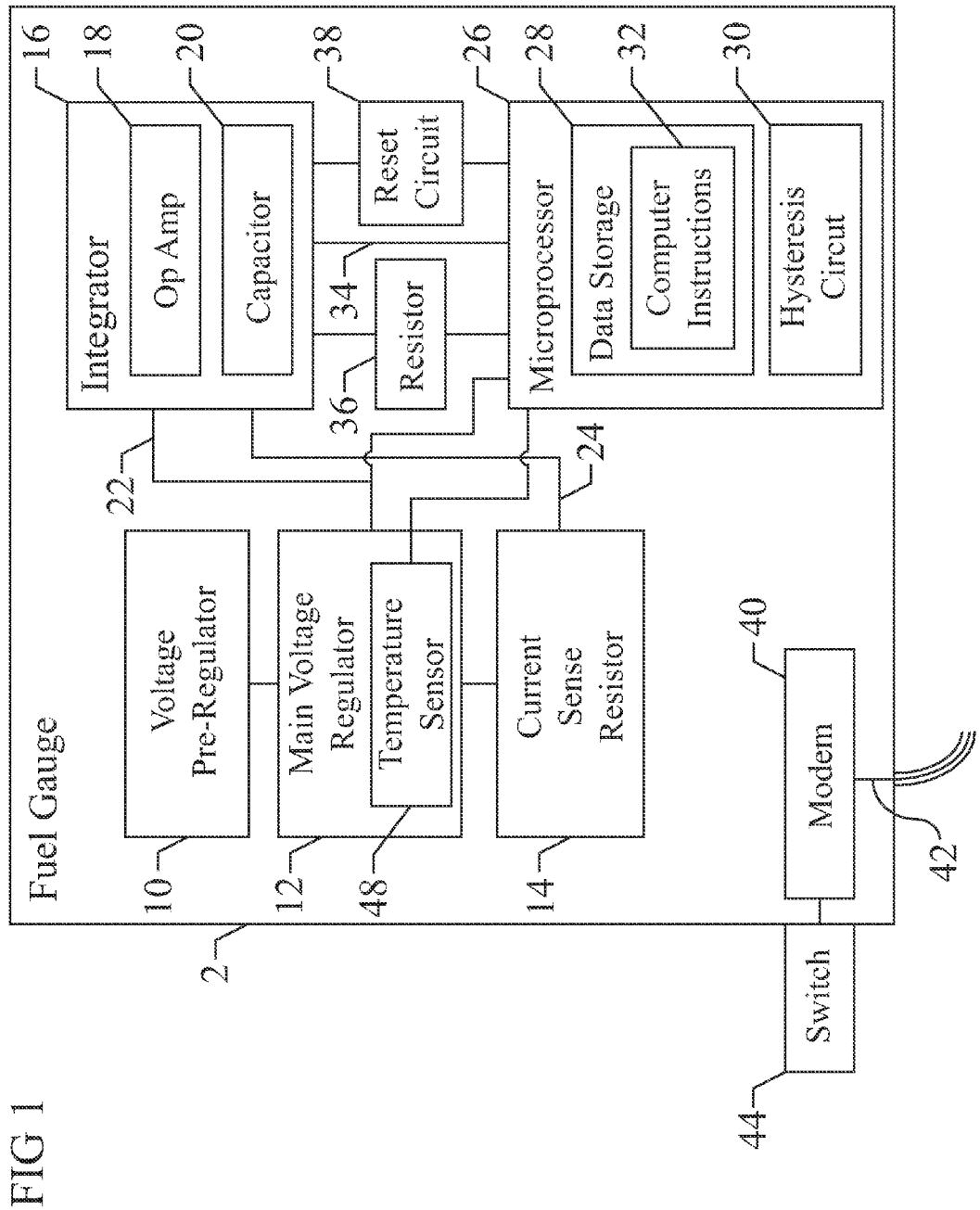
FIG. 1 is a diagram of the fuel gauge of the invention.

FIG. 1 shows an embodiment of the present fuel gauge. The fuel gauge (2) is shown having a voltage pre-regulator (10). The voltage pre-regulator (10) is designed for 10-80V applications to provide about 6 Volts. In an embodiment, the voltage pre-regulator can be resistant to extreme temperature, high pressure, shock and vibration.

Additionally, the fuel gauge can have a main voltage regulator (12) in communication with the voltage pre-regulator. The main voltage regulator can be a band gap device for precision measurement applications, precise to within about 1 percent. In an embodiment, the main voltage regulator can have a maximum voltage tolerance of about 80V. In one embodiment the main voltage regulator can contain a temperature sensor (48).

An example of the voltage pre-regulator can be one such as LT3014BES5 made by Micropower. An example of the main voltage regulator can be among the voltage regulators produced by Analog Devices.

A current sense resistor (14) can be a WSL2512R1000FEA made by Vishay of Pennsylvania can be in communication with the main voltage regulator (12) for converting the current to a voltage proportional to the current.

In an embodiment, the main voltage regulator can be a precision regulator, and the current sense resistor can be a precision resistor.

An integrator (16) is shown, having an op amp (18) such as a LTC2054HS5, made by Linear Technologies, and a capacitor (20). The integrator receives power (22) from the main voltage regulator (12), and receives an input voltage proportional to current (24) from the current sense resistor (14). In an embodiment, the integrator can have a saturation voltage ranging from about 0 volts to about 3 volts.

A microprocessor (26) with data storage (28), such as a MC908QB8MDTE made by Freescale, can contain a hysteresis circuit (30) known to those in the field of electrical engineering. A hysteresis circuit (30) external to the microprocessor can also be contemplated for determining power supply usage as described herein. The microprocessor can be contemplated to remain in a low power state until activated. It can further be contemplated that the microprocessor consumes from about 1 microwatt to about 3 microwatts of power when in the low power state.

The data storage (28) such as memory, or a remote data storage, such as a hard drive in communication with the microprocessor (26) via a network, can include computer instructions (32) for instructing the microprocessor to convert the voltage proportional to current to a monotonic uni-polar representation of an aggregate number of electrons (34). In an embodiment, the microprocessor can receive power from the main voltage regulator.

A resistor (36) is disposed between the integrator and the microprocessor for activating the microprocessor from the low power state, prior to saturation of the integrator with the voltage proportional to current.

A reset circuit (38) is disposed between the integrator and the microprocessor for resetting the monotonic uni-polar representation of an aggregate number of electrons to zero once the value of the representation has been recorded by the microprocessor. In an embodiment, the reset circuit resets the integrator to zero in less than three microseconds for ensuring accuracy.

In an embodiment, the fuel gauge can include a modem (40) for providing a communication signal (42) over power lines of the fuel gauge. A switch (44) can be used for controlling power to the modem.

In an embodiment, the op amp can be a low power and low drift device. The op amp can be one such as model LTC2054HS5, available from Linear Technologies, which provides a low pollution due to noise. The op amp can receive power from the main voltage regulator. The op amp operates using a logic input that cycles to activate and deactivate the op amp.

The hysteresis circuit provides a discrete rapid output in response to a slowly changing input. The output of this circuit can be either logic 0 or 1, but input must change significantly for output to change.

The present embodiments also relate to a method for tracking electron flow from a power source using a networked system that can utilize alarms and meters, when electron flow is at a reduced level, and accurately and precisely tracks electron flow.

First, a current from a power supply is measured which is then termed "a measured current."

The power supply can be a lithium-ion battery, a lead acid battery, a fuel cell, or another source of electrical energy that provides a flow of electrons in a direct current, such as electrons generated by an alternator of a car, or a generator of a boat or RV.

Next, the measured current is converted to a voltage. The conversion occurs, in an embodiment, using a current sense resistor, such as a model WSL2512R1000FEA resister made by Vishay of Pennsylvania. In one embodiment, the current sense resistor can handle between about 0 amps and about 6 amps of current.

The current can be a pulsed current or a constant current. In an embodiment, if the current is pulsed, it can be pulsed at about 2 amps every 1 second or about 1 amp every 2 seconds, or using other variations of pulsed current. If the current is constant, for example, it can be about 100 mA.

The voltage converted from the current, is integrated into a monotonic uni-polar representation of an aggregate number of electrons. The amplitude of the voltage is representative of the aggregate number of electrons flowing through a current sense resistor after integration using a Deboo (non-inverting) integrator with a capacitor.

The Deboo integrator is a non-inverting uni-polar integrator that forms a monotonic, unidirectional signal wherein the amplitude represents the number of electrons flowing, or used, similar in operation to the tracking of mileage using a trip odometer of a car. Other integrators can be usable herein, such as passive integrators generally known to those in the field or electrical engineering.

When the integrator output voltage reaches a preset limit, or a threshold, then the monotonic uni-polar representation of the aggregate number of electrons is "read" by the microprocessor forming a reading internal to the microprocessor. This reading is representative of the fact a the preset limit has been reached and a corresponding number of electrons have passed through the current sense resistor.

Using an analog-to-digital converter, such as a AD7819 made by Analog Devices, the amplitude is identified and stored in memory of the microprocessor. Additionally, in an embodiment it is contemplated that the reading is formed using an analog to digital converter within the microprocessor.

Figure 2:
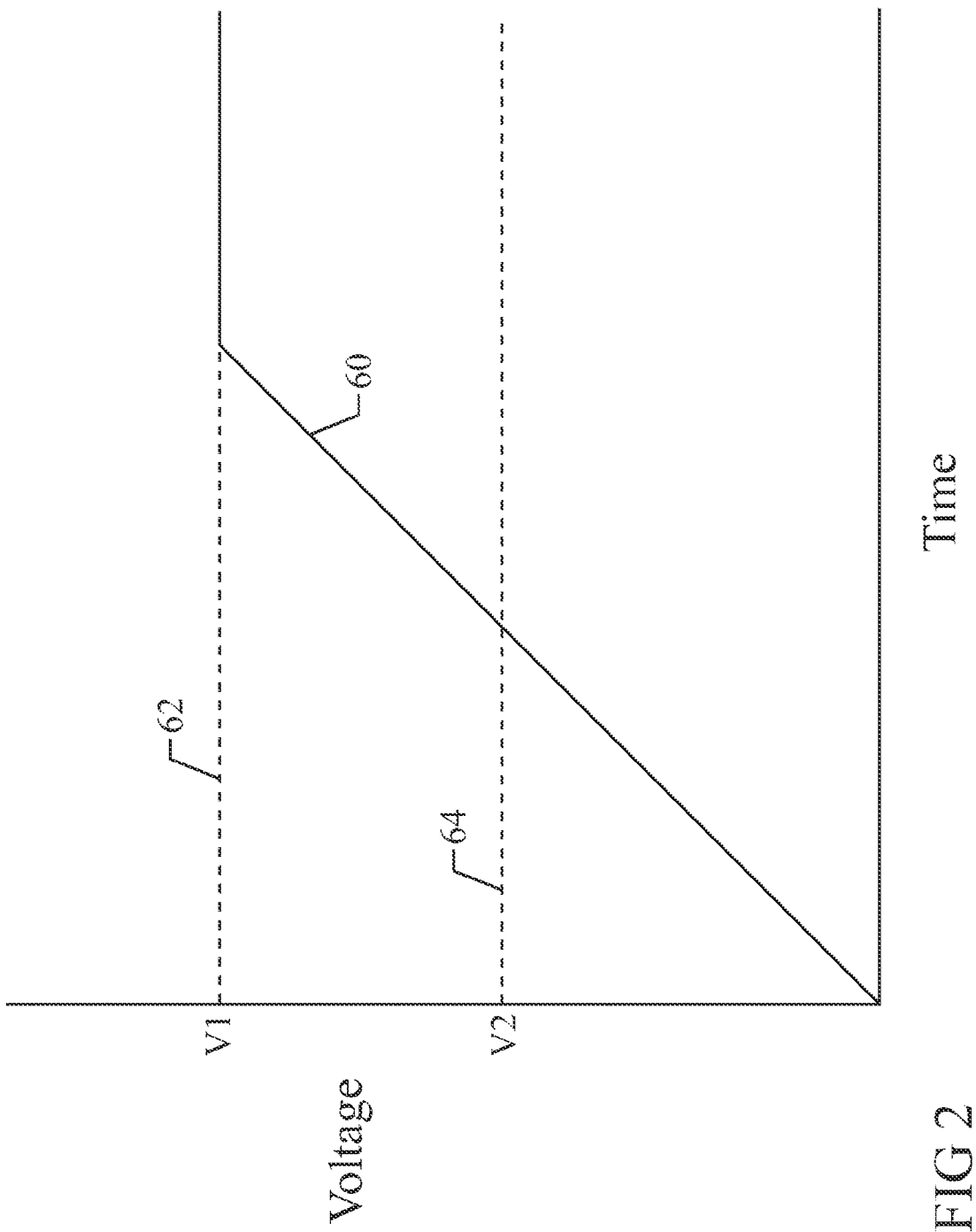
FIG. 2 shows a representative amplitude signal for use in the invention herein.

FIG. 2 illustrates a representative amplitude signal as produced by the integrator for use in the invention herein. The voltage (60) produced by the integrator circuit, as illustrated, is a function of time where a generally constant input voltage has been applied current sense resistor. FIG. 2 also illustrates the saturation point $V_1$ (62) of the integrator. It can be seen once the integrator becomes saturated the output voltage no longer increases regardless of the input voltage. FIG. 3 illustrates a preset limit $V_2$ (64), which is selected at a voltage below the saturation point $V_1$ (62) of the integrator. It should be appreciated the amplitude signal will vary based upon the input signal in a predictable way known to those in the art based on the configuration of the integrator.

Prior to electron saturation, the reading is made by the microprocessor, which can be MC908QBMDTE such as those made by Freescale of Austin, Tex. The microprocessor has a processor and data storage containing computer instructions for instructing the processor to accumulate amplitude measurements prior to saturation. Each reading is added to a memory location in the data storage where it is combined with previous readings forming a summation.

The microprocessor can contain instructions for storing the value of the amplitude voltage and for adding each value to a previous sum forming a running summation. This summation is representative of the total charge which has passed from the power source and is herein referred to as "an accumulator value".

Additionally, the microprocessor can contain instructions for resetting the integrator, or discharging the integrator, once the voltage of the amplitude signal reaches a preset limit. Once this occurs, the amplitude signal will be reset, and will generally increase as a function of the signal input into the integrator as previously described.

The readings are repeated by actuating of the microprocessor when the integrator reaches the preset limit, for the particular power source. With each reading, the reading value is transmitted to the accumulator, and the summation continues, causing the accumulator value to increase or remain constant, but never decrease.

The summation is then compared to a calibration value, which can be unique to the fuel gauge. The calibration value is preloaded in the data storage. The calibration value is unique to each designated fuel gauge circuit. An example of a calibration value is 14,000. It should be noted that when the accumulator reaches the calibration constant, a known quantity of power has been supplied, such as 1 mAH, enabling an accurate determination of the capacity of the power supply.

The comparison is then recorded as an established standard engineering unit of capacity, such as Amp Hours.

The fuel gauge can be useable for high precision tracking of electron flow to determine capacity. The fuel gauge can further operate by counting electrons from a power source.

In an additional embodiment, the fuel gauge can monitor and record ambient temperature, the temperature surrounding the power supply, using a temperature sensor. After the temperature is read, then the established standard engineering unit of capacity can be adjusted based on the ambient temperature.

The monotonic uni-polar representation of the aggregate number of electrons is, in an embodiment, a non-pulsed rising signal with only one value for any given input. FIG. 2 depicts this non-pulsed rising signal with only one value for any given input.

In the fuel gauge, the current sense resistor is a sensor that determines current proportional to voltage. An example of such a current sense resistor is model WSL2512R1000FEA made by Vishay having offices in Pennsylvania.

The microprocessor used in the method enables the sensing of electron flow at temperatures ranging from about −40 degrees Centigrade to about 150 degrees Centigrade.

The established standard engineering unit of capacity from the microprocessor can be determined using a reader generally known to those in the art of electrical engineering In one embodiment, the fuel gauge can have a reader that communicates the established standard engineering unit of capacity to a user using at least one light emitting diode.

The communication from the reader can be provided over a wireless network, over a hard wired network, a satellite network, or a combination thereof. The user can be connected to a website, or be connected directly to a graphical user interface for viewing electron flow and fuel usage, and capacity relating to the power source.

When the reader is in communication with a network, the fuel gauge permits continuous and automatic remote monitoring of power supply capacity.

An example of automatic, and continuous, real time monitoring is with an executive dashboard that is continually pushing the data to the user, rather than the user asking for the data. This push enables better and more accurate monitoring of the fuel use.

Monitoring with an executive dashboard enables a user to view the constant status of multiple power supplies, such as batteries, each connected via a network, for constant and highly accurate measurement, such as within 1 mV. Monitoring using an executive dashboard also allows for less waste of fuel, particularly in a remote environment, such as a recharging station for military radios in the middle of a barren arctic wasteland.

In an embodiment it is contemplated that the capacitor of the integrator can have at least two miniature 0.01 microfarad value capacitors, each having a low loss, high temperature rating, such as 125 Centigrade, with a moderately high capacitance.

It is contemplated that a moderately high capacitance can be equivalent to about 0.22 microfarads for each capacitor.

The two capacitors are contemplated to be connected in parallel and therefore provide a capacitance of about 0.44 total microfarad An example of such a miniature 0.01 microfarad capacitor would be a high tech plastic fill capacitor made by Fujitsu.

A different embodiment contemplates that the capacitor can be a precision capacitor, which can have a capacity of about 0.02.

It should be noted that the preset limit of aggregate electrons is no more than 3 volts using a 12 bit converter.

Additionally, in an embodiment it is contemplated that the reading can be formed using an analog to digital converter within the microprocessor.

While these embodiments have been described with emphasis on the embodiments, it should be understood that within the scope of the appended claims, the embodiments might be practiced other than as specifically described herein.

What is claimed is:

1. A fuel gauge for fuel cells, batteries, and solar power systems (4), the fuel gauge comprising:
   a voltage pre-regulator;
   a main voltage regulator in communication with the voltage pre-regulator;
   a current sense resistor in communication with the main voltage regulator;
   an integrator comprising an op amp and a capacitor, wherein the integrator receives power from the main voltage regulator, and receives a voltage proportional to current from the current sense resistor;
   a microprocessor comprising data storage and a hysteresis circuit, wherein the microprocessor operates in a low power state until activated by a resistor, and wherein the data storage comprises computer instructions for instructing the microprocessor to convert the voltage proportional to current to a monotonic uni-polar representation of an aggregate number of electrons; and wherein the resistor is disposed between the integrator and the microprocessor for activating the microprocessor from the low power state prior to saturation of the integrator with the voltage proportional to current; and
   a reset circuit disposed between the microprocessor and the integrator for resetting the monotonic uni-polar representation of an aggregate number of electrons to zero.

2. The fuel gauge of claim 1, wherein the microprocessor receives power from the main voltage regulator.

3. The fuel gauge of claim 1, further comprising a modem for providing a communication signal over power lines of the fuel gauge.

4. The fuel gauge of claim 3, further comprising a switch for controlling power to the modem.

5. The fuel gauge of claim 1, wherein the voltage pre-regulator is resistant to extreme temperature, high pressure, shock and vibration.

6. The fuel gauge of claim 1, wherein the main voltage regulator is a precision regulator.

7. The fuel gauge of claim 1, wherein the current sense resistor is a precision resistor.

8. The fuel gauge of claim 1, wherein the op amp is a low power and low drift device.

9. The fuel gauge of claim 1, wherein the hysteresis circuit provides a discrete rapid output in response to a slowly changing input.

10. The fuel gauge of claim 1, wherein the op amp receives power from the main voltage regulator.

11. The fuel gauge of claim 1, wherein the op amp operates using logic output that cycles to activate and deactivate the op amp.

12. The fuel gauge of claim 1, wherein the microprocessor consumes from one microwatt of power to three microwatts of power when in the low power state.

13. The fuel gauge of claim 1, wherein the integrator has a saturation voltage ranging from zero volts to three volts.

14. The fuel gauge of claim 1, wherein the reset circuit resets the integrator to zero in less than three microseconds for ensuring accuracy.

* * * * *